(12) United States Patent
Joo

(10) Patent No.: US 6,717,196 B2
(45) Date of Patent: Apr. 6, 2004

(54) FERROELECTRIC MEMORY DEVICE

(75) Inventor: Suk-Ho Joo, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/232,928

(22) Filed: Aug. 30, 2002

(65) Prior Publication Data

US 2003/0047764 A1 Mar. 13, 2003

(30) Foreign Application Priority Data

Sep. 13, 2001 (KR) ........................... 2001-56392

(51) Int. Cl.⁷ ............................................... H01L 29/76
(52) U.S. Cl. ...................... 257/295; 257/68; 257/71; 257/296; 257/298; 438/3; 438/240
(58) Field of Search .................. 257/68, 71, 295–314, 257/324–326; 438/3, 240

(56) References Cited

U.S. PATENT DOCUMENTS

| | | |
|---|---|---|
| 5,499,207 A | 3/1996 | Miki et al. |
| 6,043,526 A * | 3/2000 | Ochiai ........................ 257/295 |
| 6,365,955 B1 * | 4/2002 | Lee et al. ..................... 257/534 |

* cited by examiner

Primary Examiner—David Nelms
(74) Attorney, Agent, or Firm—Marger Johnson & McCollom, P.C.

(57) ABSTRACT

The present invention discloses a ferroelectric memory device and a method of forming the same. The ferroelectric memory device includes a semiconductor substrate, a capacitor lower electrode, a ferroelectric layer, and a capacitor upper electrode. The semiconductor substrate has a lower structure. The capacitor lower electrode has a cylindrical shape and a certain height. The ferroelectric layer is conformally stacked over substantially the entire surface of the semiconductor substrate including the capacitor lower electrode. The capacitor upper electrode has a spacer shape and is formed around the sidewall of the ferroelectric layer that surrounds the lower electrode. In the method of forming the ferroelectric memory device, a semiconductor substrate having an interlayer dielectric layer and a lower electrode contact formed through the interlayer dielectric layer is prepared. A cylindrical capacitor lower electrode is formed on the interlayer dielectric layer to cover the contact. A ferroelectric layer is conformally stacked at the semiconductor substrate having the capacitor lower electrode. A spacer-shaped upper electrode is formed around the sidewall of the ferroelectric layer that surrounds the capacitor lower electrode.

9 Claims, 5 Drawing Sheets

FERROELECTRIC MEMORY DEVICE

RELATED APPLICATION

This application relies for priority upon Korean Patent Application No. 2001-56392, filed on Sep. 13, 2001, the contents of which are herein incorporated by this reference in their entirety.

FIELD OF THE INVENTION

The present invention relates to a ferroelectric memory device having a ferroelectric capacitor that form a storage cell in a ferroelectric random access memory (FRAM) and to a method of forming the same.

BACKGROUND OF THE INVENTION

When an external electric field is applied to a ferroelectric substance, a polarization is generated in the ferroelectric substance. After the external electric field is removed, the polarization nevertheless remains broadly therein. Direction of a self-polarization therein can be controlled by changing the external electric field. The ferroelectric substance may be formed by processing a high-dielectric substance such as PZT (Pb(Zi,Ti)O3) or SBT (SrBi2Ta2O9). These properties of the ferroelectric substance are similar to the basic principle on which a conventional, widely-used binary memory operates.

In order to form a ferroelectric cell, a high-dielectric substance such as PZT or SBT is used, the substance having a ferroelectric crystalline structure called "perovskite structure". In a conventional method of forming the perovskite structure, a high-dielectric substance is stacked in an amorphous state, heated to about 700° C. in an ambient for oxidization, and crystallized. However, even after the perovskite structure is formed, if a physical impact is applied thereto by anisotropic etching in a subsequent process, or if a certain material such as hydrogen penetrates into the ferroelectric layer by diffusion, a serious inferiority in the properties of the ferroelectric substance may result. Fortunately, such inferiority of the resulting ferroelectric layer may be cured by an annealing process in an oxygen ambient.

When the perovskite structure is formed, or when the subsequent inferiority of the ferroelectric layer is cured, the process condition requires an oxygen ambient and high temperature. If a material such as polysilicon is used to form capacitor electrodes on and under the ferroelectric layer, at least the surface or the interface is oxidized, adversely affecting conductivity and capacitance. Thus, platinum, iridium or another noble metal is conventionally used so that the ferroelectric capacitor does not form an insulating oxide layer at a capacitor electrode contacting with the ferroelectric layer under the ambient of oxidation and at a high temperature.

FIGS. 1 and 2 are cross-sectional views illustrating the process of forming ferroelectric capacitors having planar structures frequently employed in a conventional ferroelectric memory device.

In FIG. 1, the ends of a lower electrode 16, a ferroelectric pattern 18, and an upper electrode 20 are stair-stepped, and this indicates that each layer has been formed through a separate patterning process. Referring to FIG. 1, the lower electrode layer, ferroelectric layer and upper electrode layer are sequentially stacked on an interlayer dielectric layer 12 where a capacitor lower electrode contact 14 is formed. These three layers are patterned through photolithography and etching processes to form lower electrode 16, ferroelectric pattern 18 and upper electrode 20. However, a photoresist pattern used for patterning and the noble metal layers composing each electrode layer have almost the same etch rate. Thus, they are patterned not by one photolithography process but by three successive photolithography processes.

FIG. 2 shows a similar pattern with FIG. 1. In FIG. 2, an upper electrode 20 is formed by being patterned through additional photolithography and etching processes, and a ferroelectric pattern 18 and a lower electrode 16 are formed by being patterned continuously using the same photoresist pattern (not illustrated). Thus, in this case, the photolithography process is performed twice to form the capacitor.

When a ferroelectric capacitor having a conventional planar structure is formed, it is difficult to form the entire capacitor structure by one photolithography process. Thus, the process of forming a ferroelectric capacitor becomes complicated and the cost is increased. Moreover, failure may occur during the photolithography process. Also, because the ferroelectric capacitor has a simply planar structure, increasing capacitance per unit area is difficult.

FIGS. 3 and 4 illustrate conventional ferroelectric memory devices for overcoming the limitation in the capacitance of capacitors having simple planar structures, as disclosed in the U.S. Pat. Nos. 6,043,526 and 5,499,207, respectively.

Referring to FIG. 3, an interlayer dielectric layer 12 is stacked at a semiconductor substrate 10 having a bit line 23 and a MOS transistor composed of a gate electrode 31 and source/drain regions 15, and then interlayer dielectric layer 12 is planarized. A contact 14 is formed through the interlayer dielectric layer 12 to connect a capacitor lower electrode 35 with a source region of the transistor. A cylindrical lower electrode 35 is formed on the contact 14. A barrier layer, a ferroelectric layer and an upper electrode layer are stacked by a CVD technique on the semiconductor substrate where the lower electrode 35 is formed. These layers are patterned to form an upper electrode 43, a ferroelectric pattern 41 and a barrier pattern 38. Thus, a three-dimensional ferroelectric capacitor is formed. However, even in this prior art case, two exposing processes are required, one to pattern the lower electrode layer and another to pattern the upper electrode layer and the ferroelectric layer. Also, since the lower and upper electrodes are of noble metal, when they are etched together, their profiles are not good.

Referring to FIG. 4, an interlayer dielectric layer 12 is formed at a semiconductor substrate 10 having the lower structure, and a contact plug 14 is formed through the interlayer dielectric layer 12. A cylindrical lower electrode 35 is formed to cover the contact plug 14. Although not shown in FIG. 4, the lower electrode 35 is over-etched during patterning and the top of the interlayer dielectric layer 12 may be selectively etched to a certain depth. A conformal CVD ferroelectric layer 41 and a thick CVD upper electrode 43 are stacked over the entire surface of the semiconductor substrate 10. In this case, the upper electrode 43 is a wide-plate type that may produce parasitic capacitance and unreliable operation in a semiconductor device.

SUMMARY OF THE INVENTION

It is an object of the present invention to provide a ferroelectric memory device which decreases the number of photolithography processes to simplify the entire process when a ferroelectric capacitor is formed, and a method of forming the same. It is another object of the present invention to provide a ferroelectric memory device having a ferroelectric capacitor that has a larger capacitance per a unit area in comparison with a conventional ferroelectric capacitor having a planar structure.

The present invention is directed to a ferroelectric memory device including a semiconductor substrate, a capacitor lower electrode, a ferroelectric layer, and a capacitor upper electrode. The semiconductor substrate has a lower structure, and the capacitor lower electrode is formed into a cylindrical or rod shape having a certain height above the semiconductor substrate having the lower structure. The ferroelectric layer is conformally stacked over substantially the entire surface of the semiconductor substrate including the capacitor lower electrode. The upper electrode has a spacer shape and is formed on the ferroelectric layer around the sidewall of the capacitor lower electrode.

A hard mask pattern may be formed on the capacitor lower electrode for patterning the lower electrode. The hard mask pattern is mostly of silicon oxide and the thickness thereof is preferably thinner than half the height of the lower electrode.

Plate lines are formed in a row or column direction in a matrix comprising the memory cells to overlie parts of the ferroelectric layer, and the capacitor upper electrodes may be connected to the plate line in common. Gaps between capacitors are preferably partially filled with an insulation material, before forming the plate line. Thus, the aspect ratio of each gap is reduced to prevent void which may be caused when the plate line is formed.

A conductive oxygen barrier layer is preferably interposed between the interlayer dielectric layer including the capacitor lower electrode contact and the capacitor lower electrode, thereby preventing oxidation of the contact. An adhesive assistant layer is preferably interposed between the interlayer dielectric layer and the lower electrode, thereby increasing the adhesive force therebetween. In the present invention, kinds and sizes of the barrier layer, the ferroelectric layer, and main material layers forming the lower and upper electrodes may be the same with those in the conventional technology. Also, the etching condition may be the same.

The present invention is directed to a method of forming a ferroelectric memory device. In the method, a semiconductor substrate having an interlayer dielectric layer and a capacitor lower electrode contact is prepared. A cylindrical capacitor lower electrode is formed over the interlayer dielectric layer and the contact, thereby covering the contact. A ferroelectric layer is conformally stacked over substantially the entire surface of the semiconductor substrate including the capacitor lower electrode. A capacitor upper electrode of a spacer shape is formed on the ferroelectric layer at the sidewall of the capacitor lower electrode.

In the method of the present invention, an insulation layer is stacked on the semiconductor substrate where the capacitor upper electrode is formed, and the insulation layer is recessed to expose a part of the capacitor upper electrode and to fill a part of the gap between the capacitors. A conductive layer such as aluminum is stacked over substantially the entire surface of the semiconductor substrate having the insulation layer, and the conductive layer is patterned to form a plate line. If the conductive layer is a metal such as the aluminum, the stacking thereof may be performed by a sputtering technique.

DESCRIPTION OF THE PREFERRED EMBODIMENT

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1:
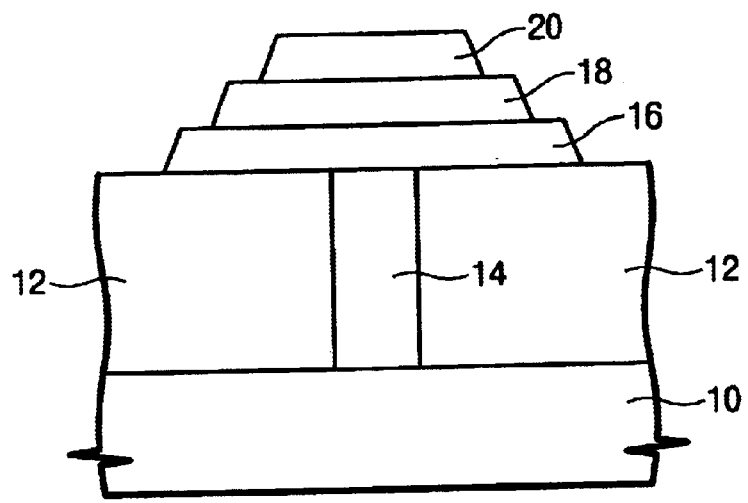
FIGS. 1 and 2 are cross-sectional views illustrating processes forming ferroelectric capacitors having planar structures that which are frequently employed in conventional ferroelectric memory devices.
Figure 2:
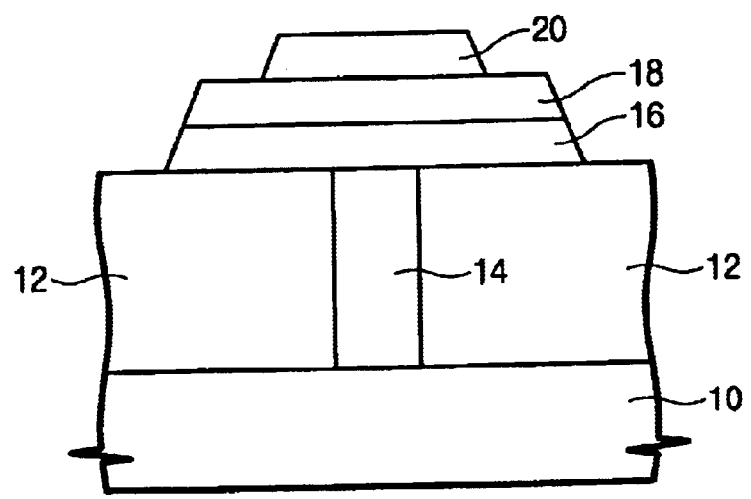
Figure 3:
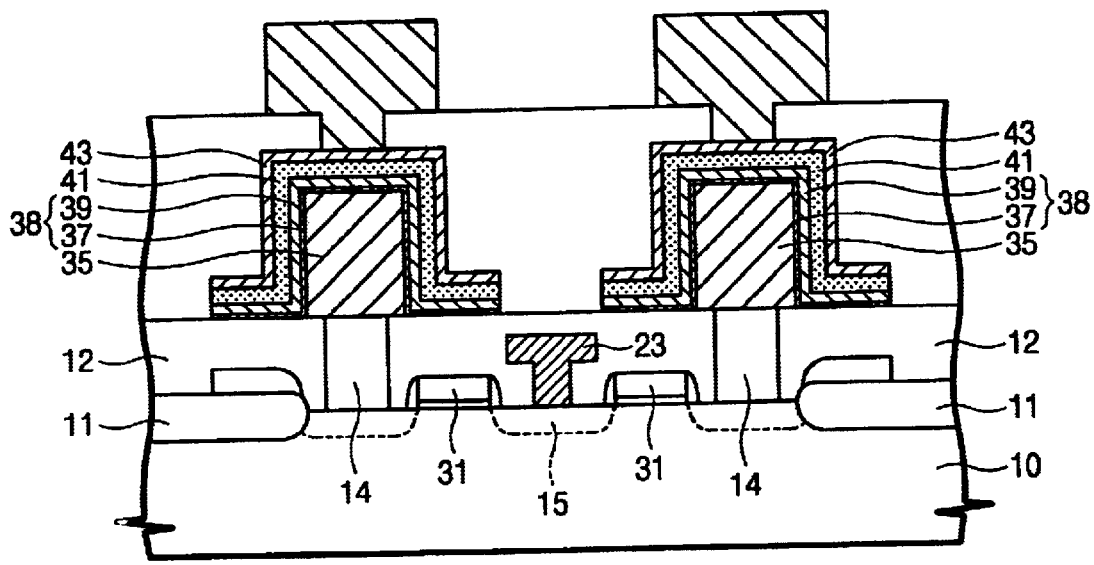
FIGS. 3 and 4 illustrate conventional approaches for overcoming limitations in capacitance of capacitors having simple planar structures.
Figure 4:
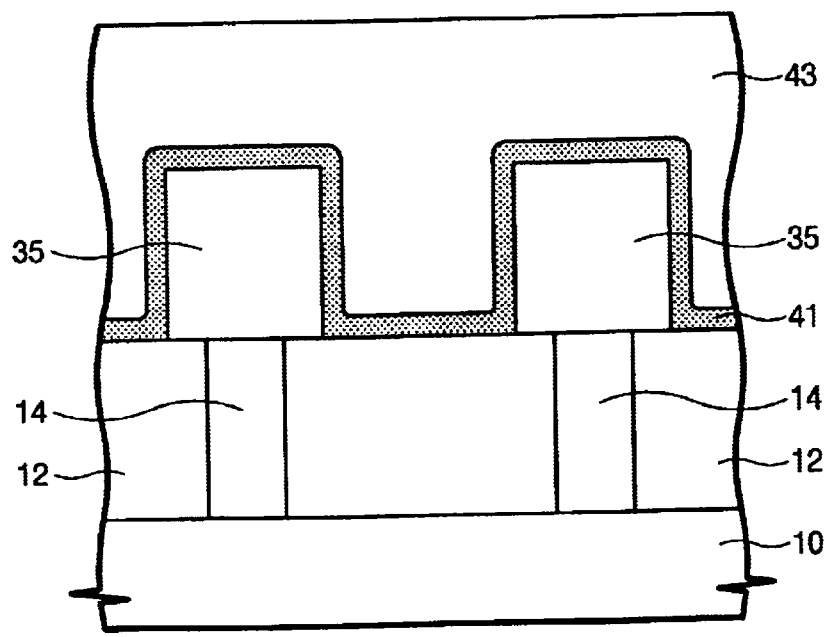
Figure 5:
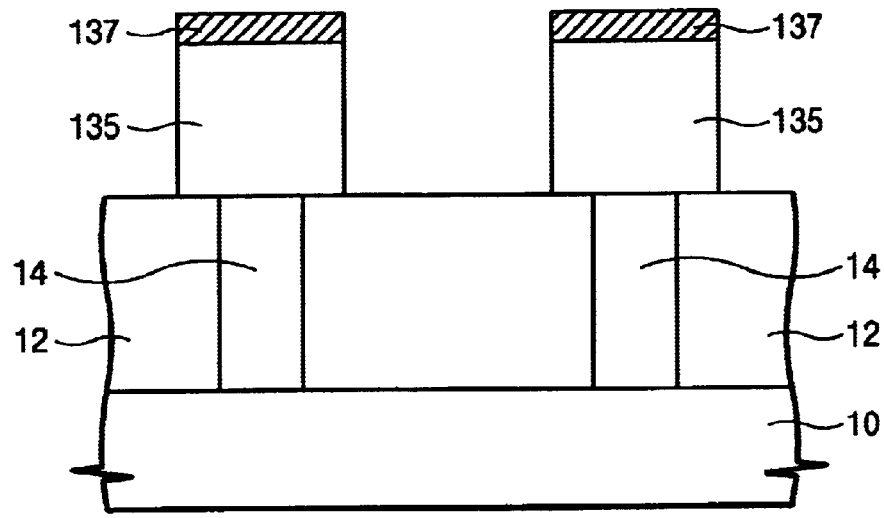
FIGS. 5 through 9 are cross-sectional views illustrating important steps of forming a ferroelectric capacitor in a ferroelectric memory device according to the present invention.

Referring to FIG. 5, a memory cell transistor (not shown) and a bit line (not shown) are formed at a semiconductor substrate 10, and an interlayer dielectric layer 12 is formed on the semiconductor substrate. The interlayer dielectric layer 12 is patterned to form a contact hole exposing a conductive region of the semiconductor substrate 10, and a conductive layer fills the contact hole to form a contact plug 14. A lower electrode layer is stacked to cover the contact plug 14, preferably with a thickness of approximately 5,000 Å. A hard mask layer is formed of a silicon oxide layer on the lower electrode layer, preferably with a thickness of approximately 2,000 Å. Then, the hard mask layer and the lower electrode layer are sequentially patterned through conventional photolithography and etching processes to form a lower electrode. The lower electrode layer may be formed of a combination layer including at least one selected from a group of platinum, iridium, ruthenium, tantalum, osmium, palladium, and rhodium, and a conductive oxide of the group, for keeping conductivity in a subsequent process of thermally treating a ferroelectric layer.

Before stacking the lower electrode layer, a conductive adhesive assistant layer may be additionally stacked to increase the adhesive force of the lower electrode layer with respect to the interlayer dielectric layer. The adhesive assistant layer alleviates stress between a lower electrode layer and an interlayer dielectric layer due to the thermal treatment process. The adhesive assistant layer may be formed of one selected from a group of titanium, titanium nitride, titanium aluminum nitride (TiAlN), titanium silicide, and titanium silonitride (TiSiN). Alternative adhesive assistant layers may include a metal having a high melting point, such as tantalum, iridium, ruthenium, tungsten; silicide thereof; nitride thereof; oxide thereof; tantalum silonitride (TaSiN); and tantalum aluminum nitride (TaAlN).

After forming the lower electrode layer, when a high-dielectric layer is stacked and a ferroelectric thermal process is performed for forming a perovskite structure of the high-dielectric layer, the contact plug may be oxidized at the interface between the contact plug and the lower electrode layer, thereby forming a nonconductor. Oxygen may undesirably flow in through the lower electrode layer or through the interface between the lower electrode and the interlayer dielectric layer, thereby oxidizing the contact plug. Thus, an additional conductive barrier layer may be stacked to prevent the input of the oxygen before stacking the lower electrode layer. Preferably, the oxygen barrier layer may be formed before forming the adhesive assistant layer. The oxygen barrier layer is of a metal having a high melting point, such as iridium, ruthenium, oxide of the metal, or combination material thereof.

In an anisotropical etching process, with respect to the lower electrode layer, a photoresist pattern and the lower electrode layer typically have a low etch selectivity. This can result in a difficulty wherein a polymer is produced that may result in a slope-etching tendency. The hard mask layer is used to prevent this problem and to form a vertical sidewall. A damascene process can be used to form the lower electrode. Thus, a sacrificial oxide layer is formed on the interlayer dielectric layer, a node hole is formed at a region where the lower electrode will be formed, and a lower electrode material fills the node hole by using an electroplate method. The hard mask layer may be a single layer or a multiple layer including at least one selected from a group of silicon oxide, titanium nitride, titanium, titanium oxide and BST. A photoresist pattern (not shown) is formed on the hard mask layer and is used as an etch mask to form a hard mask pattern 137 covering a lower electrode region. The photoresist pattern is removed by ashing. The lower electrode layer is etched by using the hard mask pattern 137 as an etch mask to form a lower electrode 135 of a cylindrical shape. Then, the hard mask pattern 137 may be removed.

Figure 6:
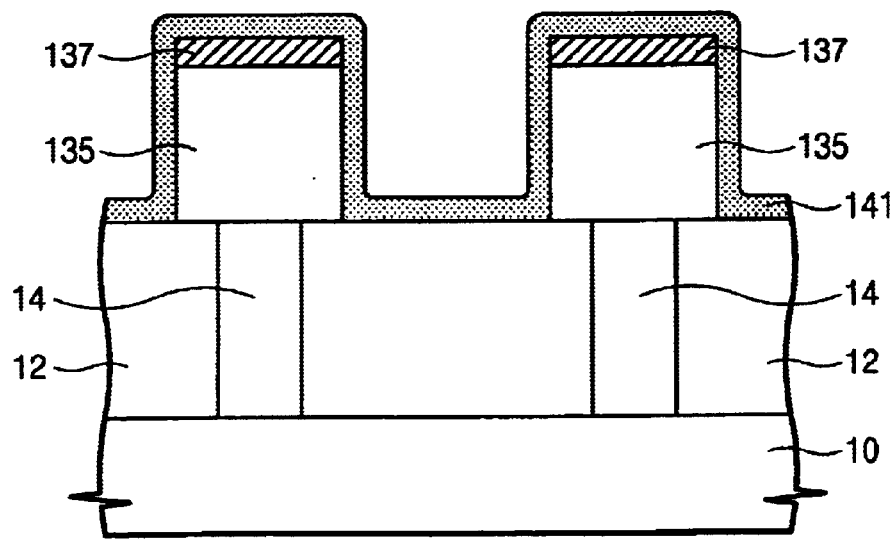

Referring to FIG. 6, a ferroelectric layer 141 is conformally stacked by a CVD technique over substantially the entire surface of the semiconductor substrate where multiple lower electrodes 135 of a cylindrical shape are formed. The ferroelectric layer 141 may be formed of a high-dielectric material which is known as a material having a high dielectric constant, such as PZT (Pb(Zr,Ti)O3), SrTiO3, BaTiO3, BST (Ba,Sr)TiO3), SBT (SrBi2Ta2O9), (Pb,La)(Zr,Ti)O3, and Bi4Ti3O12. When the ferroelectric layer 141 is formed by the CVD method, the ferroelectric layer 141 should have a good step coverage. Next, a thermal treatment process for a ferroelectric structure may be performed at a temperature of between approximately 500 and 600° C. under an oxygen ambient. This temperature is somewhat lower than the process temperature for ferroelectrically treating a high dielectric layer formed by a sol-gel change method. In order to increase an inner pressure between capacitor electrodes, after forming the ferroelectric layer 141, an aluminum oxide (Al2O3) may be thinly stacked to act as an oxygen barrier and a hydrogen barrier.

Figure 7:
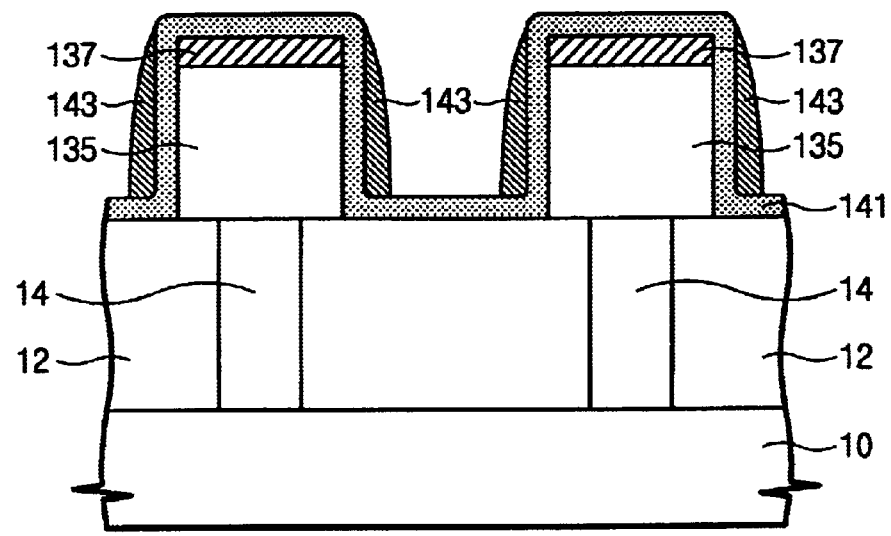

Referring to FIG. 7, an upper electrode layer is conformally stacked over the ferroelectric layer 141. The upper electrode layer may be formed by a CVD technique, an atomic layer deposition (ALD) technique or a sputtering technique. Like the lower electrode layer, the upper electrode layer may be a single layer of a noble metal such as platinum and iridium, a conductive oxide layer or a combination thereof. Then, the upper electrode layer is anisotropically etched. In this etching process, oxygen is added into combination gases including at least one selected from a group of Cl2, BCl3, HBr and Ar, to cause the upper electrode layer to have an etch selectivity with respect to the ferroelectric layer 141.

Through the anisotropical etching process, the upper electrode layer leaves spacers, i.e., an upper electrode 143, surrounding the sidewalls of the lower electrodes 135 of cylindrical shapes (with ferroelectric layer 141 interposed therebetween). Because the upper electrode 143 has a spacer shape, the sidewall of the lower electrode 135 preferably is vertical to the semiconductor substrate. The ferroelectric layer 141 is partially exposed on the lower electrode 135. Those of skill in the art will appreciate that the capacitance of a capacitor is mainly related to the height of a cylindrical lower electrode 135.

Figure 8:
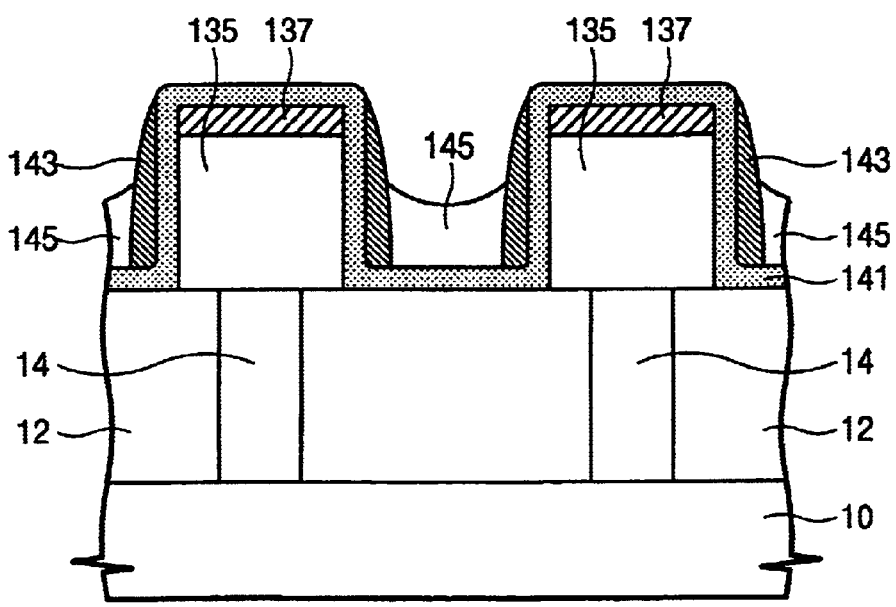

Referring to FIG. 8, a nonconductive material layer is stacked over substantially the entire surface of the semiconductor substrate 10 where the spacer-shaped upper electrode 143 is formed. The material layer is preferably thicker than half the spaced distance between the capacitor electrodes, thereby filling the gaps therebetween. The material layer is then etched to form a material pattern 145 whose top is recessed, thereby exposing the ferroelectric layer 141 on the capacitor and a top part of the upper electrode 143. In this etching process, an etching combination gas including at least one selected from a group of CHF3, CF4, Ar and N2 is supplied to make the material layer have etch selectivities with respect to the upper electrode 143 and the ferroelectric layer 141. The material layer is conventionally anisotropically etched, but alternatively may be isotropically etched.

Figure 9:
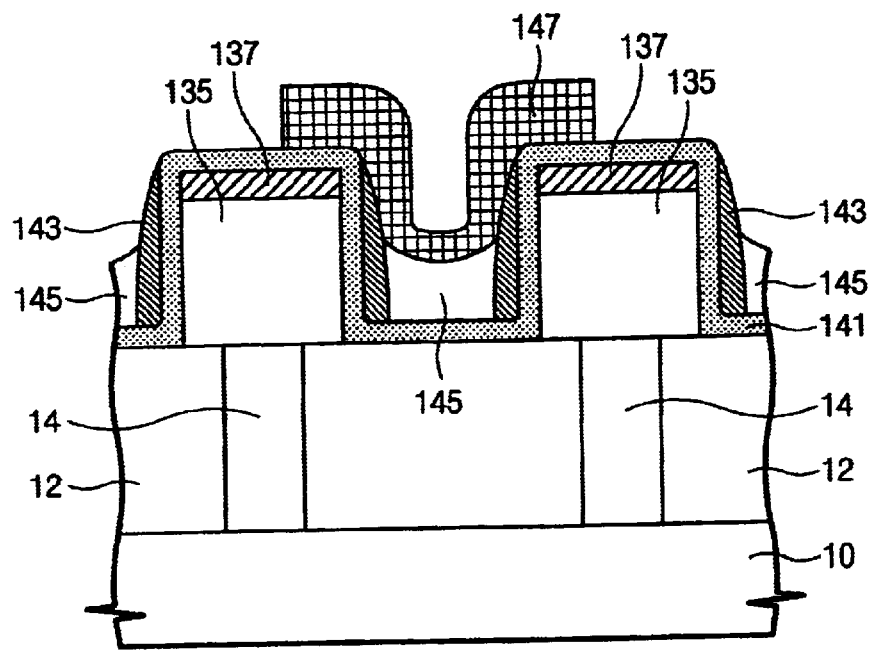
Figure 10:
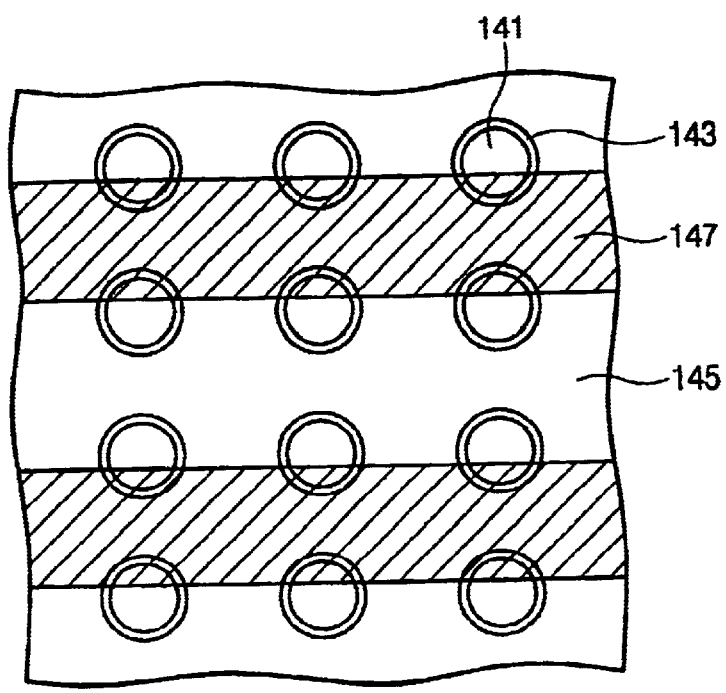
FIG. 10 illustrates a top plan view of a part of a cell memory corresponding to a step illustrated in FIG. 9.

Referring collectively now to FIGS. 9 and 10, as a conductive layer, an aluminum layer is stacked at the semiconductor substrate 10 where the gap between capacitors is partially filled with the material pattern 145. Since the gap has been partially filled with the material pattern 145, the aspect ratio thereof is decreased, and the aluminum layer may be stacked by a sputtering method which has a relatively inferior step coverage characteristic.

The aluminum layer is patterned to form plate lines 147 in a direction of a row or a column in a matrix composed by memory cells. Each plate line 147 is formed to connect with capacitor upper electrodes 143 of cells composing a row or a column of the memory cell matrix. If the centers of the plate lines 147 are located between rows or columns of the memory cell matrix and the width of the plate line 147 is wider than the gap between the capacitors, it is possible to connect capacitor upper electrodes 143 of memory cells composing the rows or the columns which are located at both sides of one plate line 147, as shown. FIG. 9 only shows a cross-sectional view in which two capacitors are connected with the plate line 147, while it will be appreciated that FIG. 10 shows instances of such series interconnected capacitor pairs.

According to the present invention, when a ferroelectric capacitor is formed, the numbers of exposing processes may be decreased to simplify the entire process, and a ferroelectric layer is formed in a three-dimensional configuration to obtain larger capacitance per unit area in comparison with a conventional ferroelectric capacitor having a planar structure.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A ferroelectric memory device of a memory cell, comprising:

a semiconductor substrate;

a capacitor lower electrode of a generally cylindrical shape having a certain height, being formed over the semiconductor substrate;

a ferroelectric layer conformally stacked over substantially the entire surface of the semiconductor substrate including the capacitor lower electrode; and a capacitor upper electrode having the shape of a spacer, the upper electrode surrounding the ferroelectric layer adjacent a sidewall of the capacitor lower electrode.

2. The ferroelectric memory device as claimed in claim 1, further comprising a hard mask pattern interposed between the top of the capacitor lower electrode and the ferroelectric layer and used for patterning the capacitor lower electrode.

3. The ferroelectric memory device as claimed in claim 2, wherein the hard mask pattern is formed of a material selected from the group consisting of silicon oxide, titanium nitride, titanium, titanium oxide, and BST, or a combination thereof, the hard mask pattern having a thickness less than a half the height of the lower electrode.

4. The ferroelectric memory device as claimed in claim 1, further comprising multiple plate lines parallel to one another along rows or columns in a matrix of plural ones of such a memory cell.

5. The ferroelectric memory device as claimed in claim 4, further comprising a material pattern partially filling a region between adjacent capacitors while exposing an upper portion of the upper electrode, wherein the plate line is formed on the material pattern.

6. The ferroelectric memory device as claimed in claim 4, wherein a center line of the plate line is located between two rows of the matrix, the plate line being wider than a distance between the capacitor upper electrodes within the two rows, the plate line extending along the two rows to connect all capacitor upper electrodes of the memory cells within the two rows.

7. The ferroelectric memory device as claimed in claim 1, further comprising:

an oxygen barrier pattern; and an adhesive assistant pattern between the semiconductor substrate and the lower electrode for increasing the adhesive force of the lower electrode with respect to the semiconductor substrate, wherein the adhesive assistant pattern is composed of at least one metal selected from the group consisting of titanium, titanium nitride, titanium silicide, titanium aluminum nitride (TiAlN), titanium silonitride (TiSiN), tantalum, iridium, ruthenium, tungsten, a silicide thereof, and a nitride thereof.

8. The ferroelectric memory device as claimed in claim 1, wherein the semiconductor substrate includes an interlayer dielectric layer and a capacitor lower electrode contact formed in and through the interlayer dielectric layer.

9. The ferroelectric memory device as claimed in claim 1, wherein each of the upper electrode and the lower electrode is formed of a single layer or a multiple layer including a metal selected from the group consisting of platinum, ruthenium, iridium, rhodium, osmium, palladium, and a conductive oxide thereof, or a combination thereof.

* * * * *